(12) United States Patent
Hudecek et al.

(10) Patent No.: US 6,675,001 B2
(45) Date of Patent: Jan. 6, 2004

(54) TWO-DIMENSIONAL TUNING SYSTEM FOR COMPUTER-CONTROLLED RADIO EQUIPMENT

(75) Inventors: Milan Hudecek, Caulfield (AU); Alexander L. Kostromitin, Ekaterinburg (RU)

(73) Assignee: Rosetta Laboratories Pty Ltd. (AU)

( * ) Notice: Subject to any disclaimer, the term of this patent is extended or adjusted under 35 U.S.C. 154(b) by 534 days.

(21) Appl. No.: 09/778,608

(22) Filed: Feb. 7, 2001

(65) Prior Publication Data

US 2001/0034218 A1 Oct. 25, 2001

Related U.S. Application Data

(60) Provisional application No. 60/180,971, filed on Feb. 8, 2000.

(51) Int. Cl.$^7$ ................................................ H04B 1/18
(52) U.S. Cl. ................................ 455/150.1; 455/154.1; 455/154.2; 455/158.4
(58) Field of Search ............................... 455/3.01, 3.02, 455/3.06, 556.1, 556.2, 557, 150.1, 154.1, 154.2, 158.1–158.5, 160.1, 161.1, 277, 182.3, 192.3, 182.1; 345/772, 157, 162

(56) References Cited

U.S. PATENT DOCUMENTS 6,289,207 B1 * 9/2001 Hudecek et al. ......... 455/150.1

6,493,877 B1 * 12/2002 Yamazaki et al. .......... 725/100

FOREIGN PATENT DOCUMENTS

DE          2702449       * 7/1978    ............. H03J/1/02

* cited by examiner

Primary Examiner—Duc M. Nguyen
(74) Attorney, Agent, or Firm—Stephen D. Carver

(57) ABSTRACT

A graphical tuning system for computer-controlled radio equipment, where a two-dimensional tuning field is displayed with one axis representing frequency and the other axis representing tuning resolution. The user tunes the equipment by moving a pointer in this two-dimensional field. A spectrum display may be superimposed as a third dimension on a two-dimensional tuning field with one axis representing the frequency, the second axis representing tuning resolution and the third axis representing the signal level. The preferred tuning relationship is described by the generalized equation:

$$f2 = f1 + (x2-x1) * FR(y2-y1),$$

where f1 is the old frequency, and f2 is the new frequency, where x1, y1 are the new co-ordinates of the mouse, x2, y2 are the old co-ordinates of the mouse, and FR is a function describing a relationship between the position of the mouse and the frequency resolution.

27 Claims, 6 Drawing Sheets

TWO-DIMENSIONAL TUNING SYSTEM FOR COMPUTER-CONTROLLED RADIO EQUIPMENT

CROSS REFERENCE TO RELATED APPLICATION

This utility patent application claims the benefit of the filing date of a previously-filed, pending U.S. Provisional Patent Application, entitled "Two-Dimensional Tuning System for Computer-controlled Radio Equipment," Ser. No. 60/180,971, filed Feb. 8, 2000.

BACKGROUND OF THE INVENTION

I. Field of the Invention

The present invention relates generally to software-controlled, electronically-tuned radio equipment such as receivers, transmitters, frequency synthesizers and measurement instruments. More particularly, the present invention relates to virtual tuning dials, comprising computer-generated, graphical tuning displays that provide both a means for controlling radios, and a means of adjusting critical parameters.

II. Description of the Prior Art

Relatively recently, computer-controlled, electronic instruments have advanced to the stage where conventional "analog" control panels with mechanically-activated knobs and buttons are replaced with "virtual" displays or control panels. Virtual control panels may be displayed in great detail on an associated computer screen, preferably employing a graphical user interface (GUI). In such cases, a click of a mouse in effect replaces the push of a button, or a twist of a knob.

For example, WiNRADiO Communications markets a number of radio systems for computer operation. A number of advantages result from "marrying" radio and computer technology. Front-panel functions are more flexible and powerful than those of traditional radios. There simply is not enough physical space on the fixed front panel of traditional receivers for the multitude of settings and options which are available on WiNRADiO computer receivers. With computer radios there is little need to memorize anything—modern computer-controlled receivers are simple and intuitive to use, and comprehensive online help is usually available. Such receivers have practically unlimited memory. Radio memories are limited only by the space available on the host computer's hard disks.

New functions, for example databases, or various signal processing and decoding programs, can be integrated with radio control software. Modern WiNRADiO receivers have been designed with multi-channel operations in mind. A single personal computer can contain and control several virtual receivers. With several receivers installed and activated, the activity on several radio bands can be monitored simultaneously.

Another advantage of computer radios is that the processing power of the host PC can be used to "process" received radio signals. Most modern PCs have more processing power than dedicated Digital Signal Processors of just several years ago. WiNRADiO receivers take full advantage of this, and powerful spectrum displays are generated by the software. It is important for the modern user not just listen, but to "see" the activity on the selected bands. Conventional non-computer receivers seldom have powerful, built-in spectrum scopes or displays.

WiNRADiO offers receivers based on internal PC boards, as well as external types which are connected to a PC using cables. Both types have their advantages. The advantage of the internal models are in their neatness—there are no cables or external power supplies required, no external interface ports are occupied and no extra desk space is needed. A PC with a WiNRADiO card inside is very inconspicuous—nobody needs to know that there is a wide-band communications receiver hidden inside! Multi-channel operation is simple to achieve with WiNRADiO internal receivers, which are designed to allow for up to eight receivers independently controlled by a single PC.

The advantage of external models is in their portability. The optional plug-and-play PC card interface (PCMCIA) allows a very fast and simple installation for any portable PC. The serial RS-232 interface is available as standard. Rechargeable battery power supplies are available as an option for all WiNRADiO external models.

With WiNRADiO, and other similar computer-based radios, virtual radio control panels have followed a "traditional" approach by graphically representing "conventional" receiver knobs, buttons and "dials." In other words, formerly-required radio hardware parts like knobs, dials and the like are simply replaced in computer radios with corresponding graphical images. In some radios a traditional "slide rule" frequency-indicating dial may be emulated. More often, the chosen frequency is displayed on the computer screen through a graphical emulation of a modern "digital" dial or readout employed by late model radios, wherein the selected frequency is indicated in bold, illuminated digits. Even with radios of the latter characteristics, a virtual tuning knob is displayed graphically. To select a desired operating frequency, the virtual knob is "rotated" clockwise or counterclockwise by the operator by appropriately "clicking" on the knob's image with the comport mouse. By appropriately pointing and clicking the mouse on other virtual images, all aspects or parameters of radio operation, such as volume level, scanning rates, selectivity, etc. may be virtually controlled.

The approach of graphical representation of conventional controls has the advantage in providing a familiar environment for a user, but it does not go far enough in taking advantage of what computer technology offers. In particular, it does not address a common problem with conventional receivers, that is the need to span a very wide frequency band (more then 1 GHz in the case of WiNRADiO receivers) with a small required resolution (1 Hz). In other words, there are 1,000,000,000 discrete frequencies (tuning points) the receiver needs to be able to tune to. Presently, these frequencies are either simply typed in, or can be finely tuned to with a knob within a certain range. However, tuning a wide-band receiver solely using a conventional-style fine-tune knob (or its graphical representation) is not feasible because of the large frequency band this would have to span, and the number of tuning points necessary for the fine resolution needed in contemporary receivers. Many hundreds or even thousands of turns would be needed to span the entire range of a wide-band receiver.

In our view, electronically controlled computer receivers can be made much more versatile and powerful by designing improved graphical control systems which would go far beyond a conventional tuning knob. We have discovered that new graphical tuning dials for example, that make no effort to simulate older analog radio parts, can empower the user with enhanced control options and versatility. An enhanced graphical tuning display, for example, can be "software designed" to provide much more that frequency control and/or display. Our visual system enables the spanning of entire frequency ranges quickly and efficiently. The system provides an option for changing from course tuning to fine tuning without the need of adjusting such resolution parameters separately, and without the need for "clicking" on ancillary knobs or buttons, in fact without the need of using a keyboard for typing frequencies in whatsoever.

SUMMARY OF THE INVENTION

Our radio display system departs from "conventional" virtual imagery techniques wherein "conventional" radio parts such as tuning knobs are indicated graphically for mouse control. Since the computer graphically indicates or draws a screen, the "tuning dial" may be designed for greatly-enhanced tuning features and characteristics. We can make a break with the past—the system need not emulate "conventional" knobs or radio controls at all; instead, an entirely new "species" of graphical imagery may be displayed for user control.

Our computer-generated frequency display is preferably a two-dimensional field. In a rectangular coordinate system, which is the simplest and preferred embodiment of our invention, the horizontal dimension preferably represents frequency, and the vertical dimension or field represents tuning "resolution." Moving the mouse within this two-dimensional field, the operator can very quickly span the entire range of a wide-band receiver, and yet achieve the highest tuning resolution when "homing" on a signal. Moreover, the operator can finely "tune" the tuning resolution itself, thus achieving optimum speed when working within a given frequency band.

Thus, a basic object of our invention is to provide a new and enhanced graphical tuning system for computer-based radios.

Another broad object is to provide computer hardware and software for computer controlled radios based upon our enhanced computer-based tuning.

A more particular object is to provide a graphical tuning system of the character described that concurrently indicates and enables control of frequency and tuning resolution. It is a feature of our two-dimensional graphical display that one axis of the display represents frequency, and the other axis represents resolution.

Another object is to provide a display system of the character described that enables not only mouse-controlled frequency selection, but a varying "rate" of frequency change. It is a feature of our invention that by placing the mouse cursor in different vertical positions of our display, the frequency rate of change in relation to mouse cursor movement is effectively varied.

Another basic object is to provide a radio frequency selection and display system of the character described, wherein the user's mouse offers complete control as the cursor is constrained within a graphically displayed two-dimensional field.

Yet another object is to provide a spectrum display concurrently with the aforementioned tuning display. It is a feature of our invention that the spectrum display may be superimposed as a third dimension on a two-dimensional tuning field.

Another important object is to provide a display system of the character described that may be software-implemented with a variety of different makes and models of computer radios.

A related object is to provide a display system of the character described that may be implemented with both internal and external computer radios.

These and other objects and advantages of the present invention, along with features of novelty appurtenant thereto, will appear or become apparent in the course of the following descriptive sections.

BRIEF DESCRIPTION OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION

Figure 1:
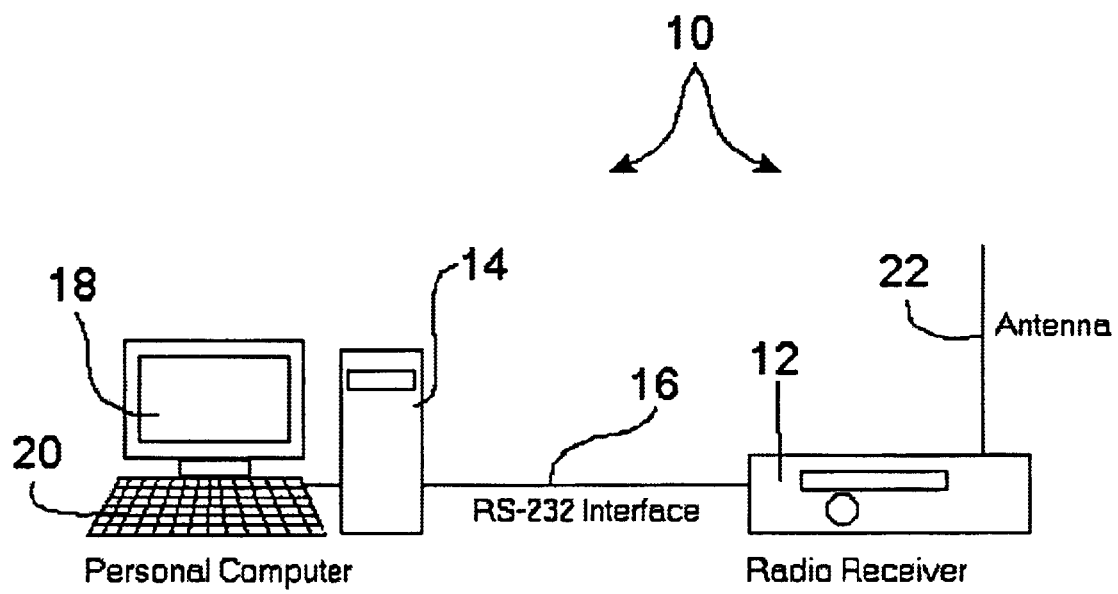
FIG. 1 is a block diagram of a typical external, computer-controlled radio receiver system with which the invention may be advantageously employed.

Turning now to FIG. 1 of the drawings, the hardware system 10 to be employed comprises a computer-controlled receiver 12 that is connected to a conventional personal computer 14 through an interface cable 16. Computer 14 has a conventional video monitor 18 and a conventional keyboard 20. This receiver utilizes a conventional antenna designated by the reference numeral 22 which for best results, should be located away from the computer to minimize noise-pickup.

In the example of FIG. 1, computer 12 is an "external" unit that sits apart from the computer 14. It is connected to the computer using an external communications interface such as RS-232, USB, Ethernet, etc. Alternatively, the receiver 12 may comprise an "internal" card-based radio that is simply plugged into the computer bus (such as ISA or PCI, etc), and housed permanently within the computer cabinet. The software which controls the receiver runs on the PC under a standard GUI operating system such us Windows 95/98, Windows NT 4.0, Windows 2000, or a variety of Unix "flavors" including the increasingly popular "Linux" variation.

In any event, the chosen receiver accepts preestablished tuning and control instructions from the computer via the interface line 16. Different manufacturers use different control sequences and codes to control their radios. For example, with the WiNRADiO WR-1500i internal radio, the following API (Application Programming Interface) command is sent to establish a desired tuning and display frequency of 453.567 MHz: Set Frequency (453567000).

Figure 2:
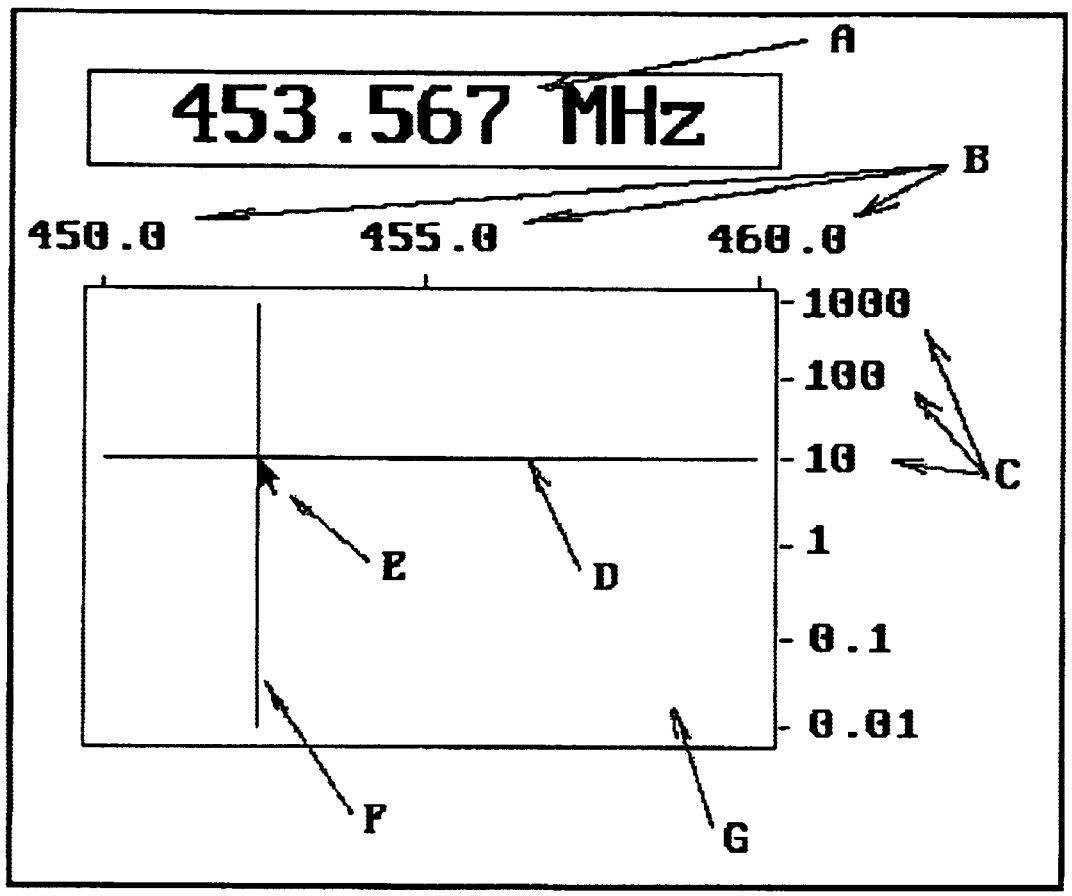
FIG. 2 is a pictorial view of the two-dimensional field concept.

The PC 14 runs the application software for tuning the receiver. This software has a graphical control panel, which, in our practical implementation, is illustrated in FIG. 2. The white rectangular area marked "G" represents a two-dimensional tuning field. When the mouse cursor "E" is placed in the field and the left mouse button is held down, the intersecting horizontal cursor "D" and vertical cursor "F" will follow the mouse movement. The horizontal cursor "D" represents the tuning resolution. This will vary from the coarsest when the cursor is placed at the top of the field, to the finest when it is at the bottom. The legend "C" on the right-hand side of the tuning field represents the current frequency span of the tuning field. If the tuning resolution is coarsest, it is preferable that the frequency span should equal to the entire frequency range of the receiver. Alternatively, the legend "C" might show the frequency resolution rather than frequency span. The frequency resolution would be equal to the frequency span (in frequency units) divided by the width of the tuning window (in pixels).

In example of FIG. 2, the current selected frequency span is 10 MHz., which is also reflected on the legend "B" which shows the current frequency limits. This legend is dynamically changed according to the vertical position of cursor "D". In other words, if the cursor is moved horizontally across the field while vertically positioned in a constant location, the radio's frequency will be tuned plus or minus five MHz. from the initial center frequency of 455.0 MHz. Thus moving of the cursor "F" from left to right results in the actual tuning of the receiver, with the tuning resolution depending on the position of cursor "D". If cursor "D" is at the top of the tuning window, then moving of cursor "F" from the leftmost to the rightmost point of the tuning field will result in the coarsest tuning of the receiver, spanning its entire frequency range in one movement. If cursor "D" is at the bottom of the tuning window, then moving of cursor "F" will result in the finest tuning of the receiver. While the mouse button is held down, the frequency display "A" will keep changing following the hand movements, and show the frequency to which the receiver is currently tuned.

Figure 3:
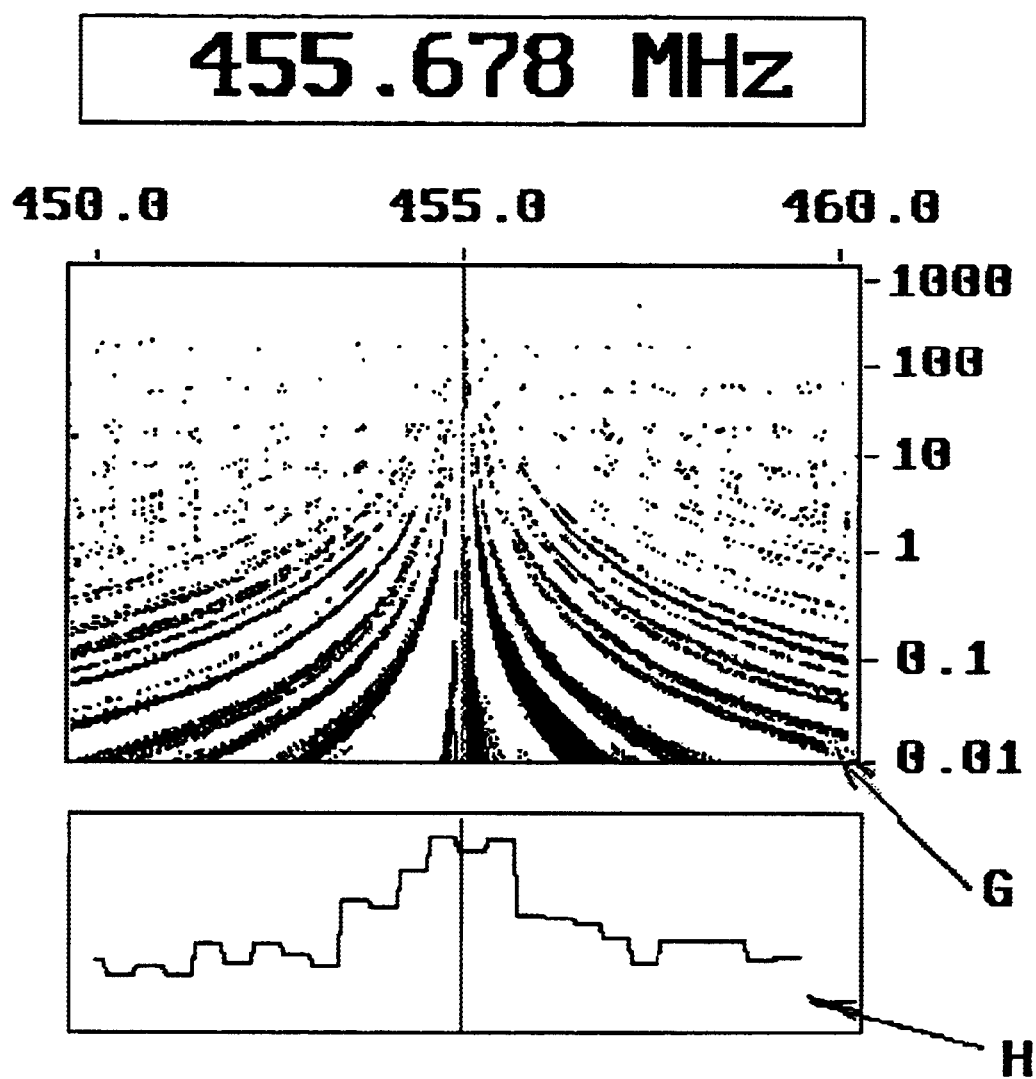
FIG. 3 is a pictorial view of a possible visual display based upon the two-dimensional field concept.

Turning to FIG. 3, it is also possible to combine the two-dimensional tuning field of FIG. 2 with a spectrum analyzer. The two-dimensional tuning area "G" shows spectral lines with increasing resolution from top to bottom. The bottom window "H" shows magnified spectrum at the lowest resolution. This is achieved by using the software algorithm of FIG. 4 to be described, with the spectrum lines superimposed on the image, using the function FR (to be described) to calculate the variations of the spectrum at various vertical positions.

In FIG. 3, by way of example only, the user has selected a frequency of 455.678 MHz. The cursor is vertically positioned to enable a possible 10 MHz. tuning swing as the cursor is moved across the field horizontally. The spectral display of field H is also drawn in bold colors beneath the spectrum lines G.

Figure 5:
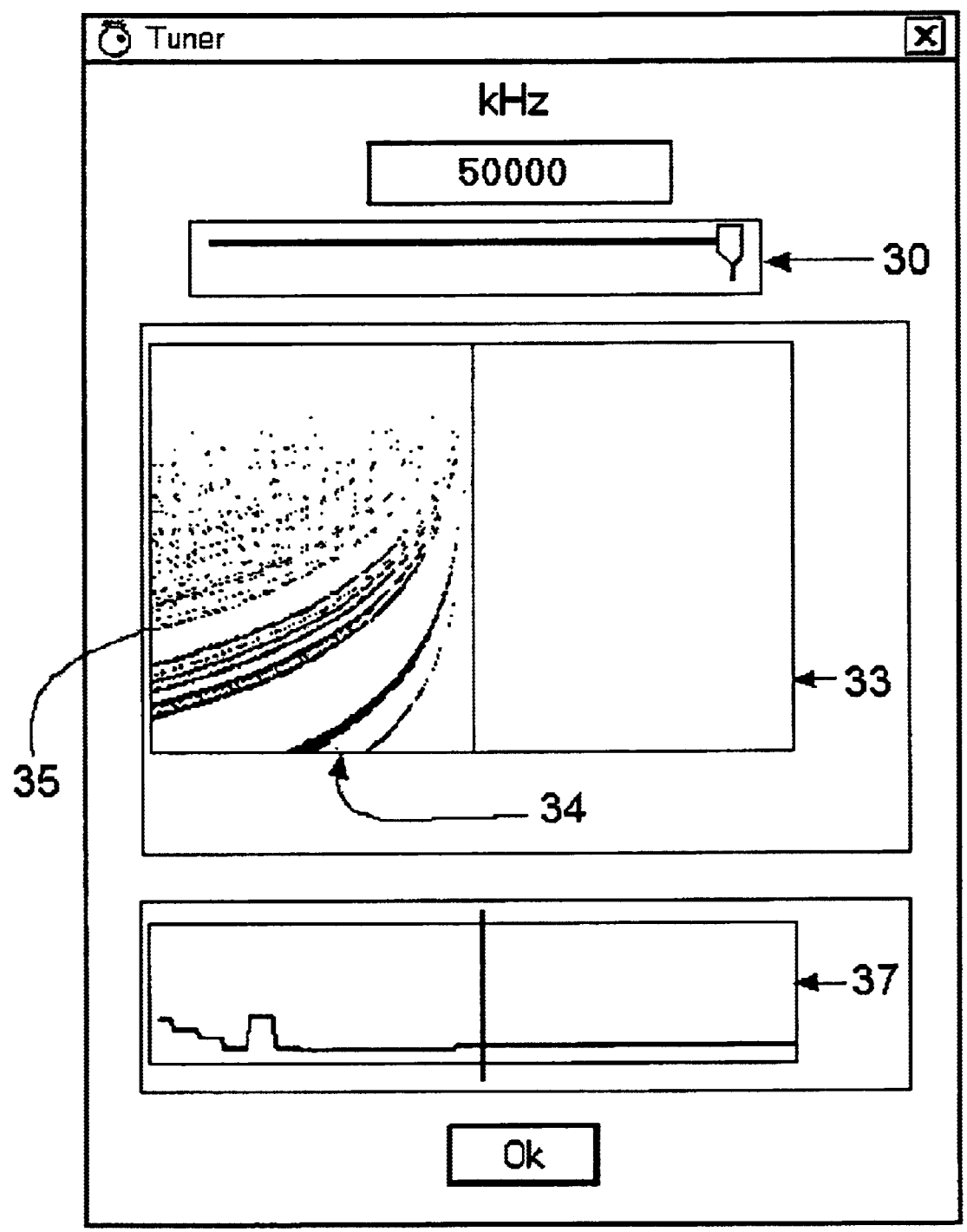
FIG. 5 is a pictorial view of the resultant visual display when the radio/computer user has selected a maximum frequency within the possible radio tuning range; and, FIG. 6 is a pictorial view of the resultant visual display when the radio/computer user has selected a minimum frequency within the radio frequency tuning range.
Figure 6:
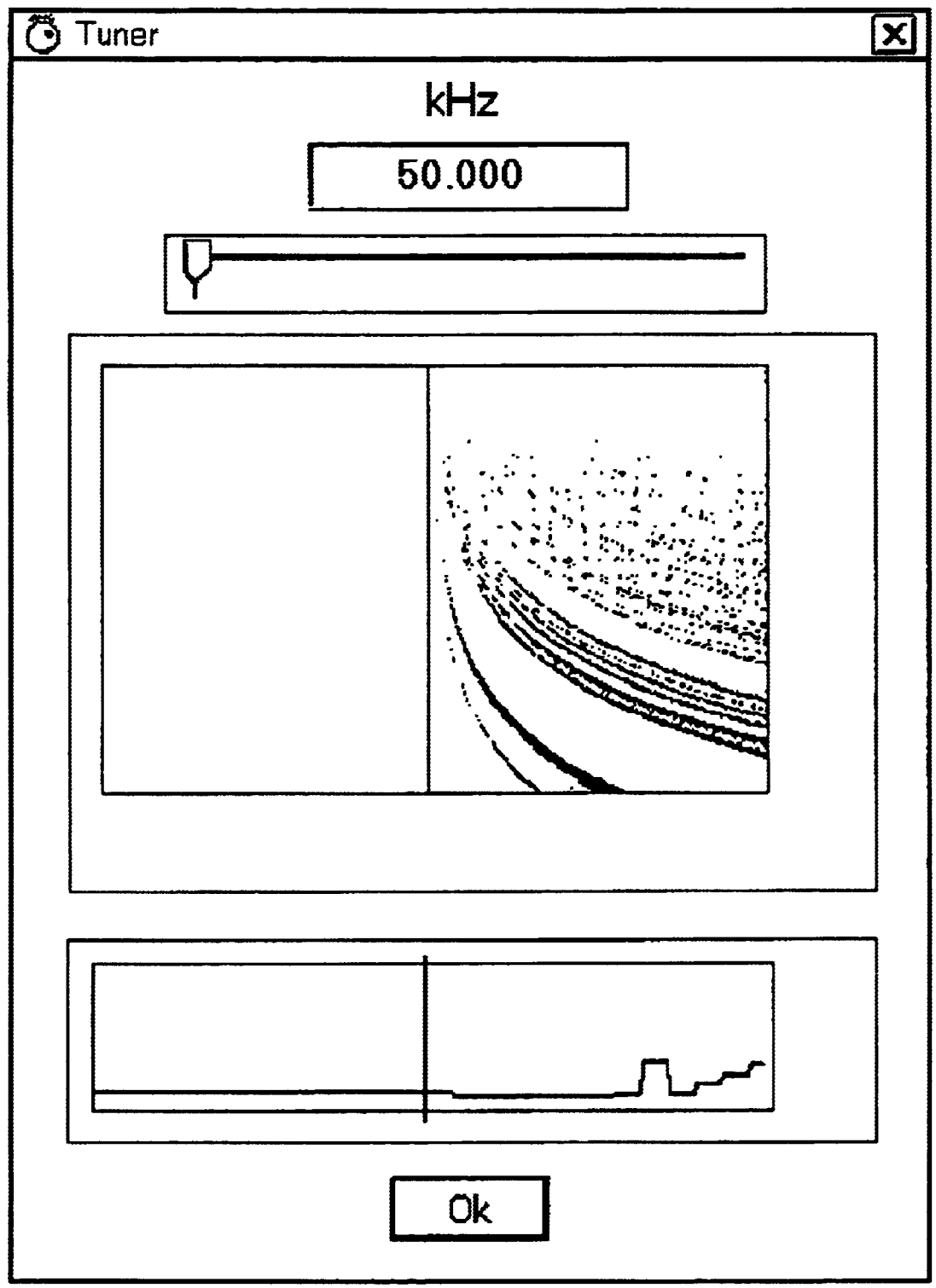

FIG. 5 shows a display similar to FIG. 3, but additionally using a mouse-operated slide bar 30 for "old fashioned" computer frequency selection. Moreover the graphical field 33 shows the display resulting when the user has moved to the maximum frequency the radio allows (i.e., 50 MHz in this example). The right side of field 33 is thus blank. The left side 35 shows he panoramic display. Beneath it is a miniature power spectral display 34, that is a miniature version of the power spectrum display in box 37. FIG. 6 illustrates what happens when the minimum frequency is chosen, which in this case is 50 kHz. Spectral lines and the display now appear only on the right side (FIG. 6).

Figure 4:
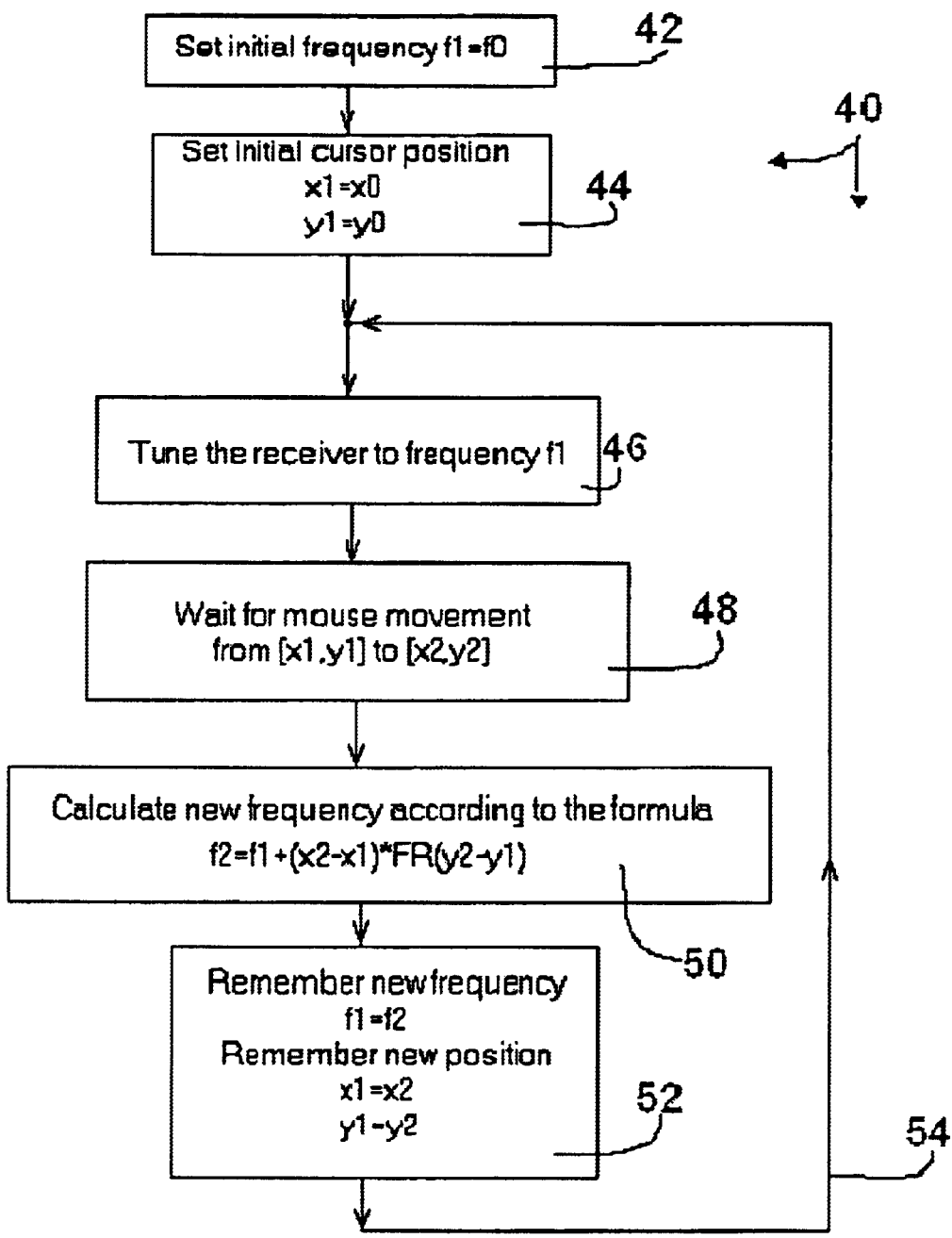
FIG. 4 is a software block diagram.

The preferred algorithm 40 executed by the software is seen in FIG. 4. In step 42 the initial frequency is determined. The initial cursor position is determined in step 44, and, in step 46, the receiver is tuned to the frequency selected in step 42. That frequency is maintained until step 48 detects mouse movement. In step 50 a new operating frequency is calculated. The function FR is a "frequency resolution function", either calculated in real time, or table-defined, which determines the relationship between the vertical cursor position, and the tuning step (tuning increment per one pixel). This function can be linear, logarithmic or other, and determines the progression from the coarse tuning (when the cursor is at the top of the tuning field), and the fine tuning (when at the bottom of the field). In step 52 the new frequency and mouse cursor positions are remembered, and return occurs on line 54 to tune the receiver to the new frequency, and repeat the process.

In box 50 (FIG. 4) the relationship is best described by the following generalized equation:

$$f2=f1=(x2-x1)*FR\ (y2-y1),$$

where f1 is the old frequency, and f2 is the new frequency, where x1, y1 are the new co-ordinates of the mouse, x2, y2 are the old co-ordinates of the mouse, and F is a function describing a relationship between the position of the mouse and the frequency resolution. This may be a simple linear function, for example:

$$FR(y)=FR_{max}+(FR_{min}-FR_{max})*(y-y_{min})/(y_{max}-y_{min}),$$

where $y_{min}$ is the minimum vertical co-ordinate ("top" in our example), $y_{max}$ is the maximum vertical co-ordinate ("bottom" in our example), $FR_{max}$ is the coarsest frequency resolution (corresponding to $y_{min}$), and $FR_{min}$ is the finest resolution (corresponding to $y_{max}$).

This simple linear function makes sure that, at the minimum vertical co-ordinate ("the highest" in our example on FIGS. 2 and 3), the resolution is the coarsest ($FR_{max}$), to make it possible to span the entire frequency range of the receiver. $FR_{max}$ can be calculated as:

$$FR_{max}=(f_{max}-f_{min})/(x_{max}-x_{min}+1),$$

where $f_{max}$ and $f_{min}$ are the maximum and the minimum frequencies the receiver can be tuned to, respectively; and $x_{max}$ and $x_{min}$ are maximum and minimum horizontal co-ordinates of the tuning window. $FR_{min}$ is equal to the tuning resolution of the receiver. For example, the WiNRA-DiO receivers have a tuning resolution of 1 Hz.

In another implementation, it may be preferable for the FR function to be a logarithmic or other function rather than the simple linear function shown in our example above. This means that, for example, with a vertical hand movement from top to bottom, the frequency resolution change would decelerate the lower the cursor moves towards the finer resolution (this is in fact the situation with our examples shown on FIGS. 2 and 3). Different "tuning characteristics" of a receiver could be employed by allowing the user to select from a palette of several "FR" functions (linear, logarithmic, step, etc.).

If a step-function is employed, the FR function could be such that the finest resolution would correspond to a typical channel separation in a particular frequency band. For example, in some VHF point-to-point communications, the step size is 25 kHz., which would then correspond to the maximum vertical co-ordinate ($y_{max}$) as described earlier.

In another interesting ramification, the FR function can be also made dependent on the actual frequency tuned to, thus making it possible to define different tuning characteristic for different frequency bands. For example, a linear or logarithmic FR function (with the finest resolution say 1 Hz.) could apply to short-wave (3–30 MHz) bands, while a step-function with the finest resolution of, say, 10 kHz., could apply to a FM radio band (88–108 MHz), where such coarse tuning resolution is preferable.

Ultimately, the user should be able to assign the most suitable FR function to any specific frequency band within the frequency range of the receiver. In one practical implementation of such concept, the user could be presented with an edit box allowing him to specify a default FR function (for example, a choice between linear and logarithmic), and an edit grid. to define "exception" bands (starting and ending frequencies), where the FR could be defined as a step function to offer a convenience of tuning within those frequency bands where radio channels are separated by equal frequency steps.

Such a step function might, for example, divide the vertical range (y-co-ordinate) to several segments, with the frequency resolution in these segments being an integral multiple of the channel spacing. If, say, the channel spacing in a particular frequency band is 25 kHz, then the frequency steps (from coarsest to finest, or from top to bottom) could be, for example, 10 MHz, 5 MHz, 1 MHz., 500 kHz, 100 kHz, 50 kHz and 25 kHz, dividing the vertical range to 7 segments, and providing a convenient method of fast navigation in this particular band.

The superimposition of a spectrum display onto the tuning field G in FIG. 2, producing results such as can be seen of FIGS. 3, 5 and 6, can be for example done in such a way that the brightness of any x, y point in field G depends on the signal level on the corresponding frequency, so that frequencies with a greater signal level generate points with higher brightness. The color of any point can be made to depend on the signal level gradient on the corresponding frequency. For example, frequencies where the signal level has a higher dependence on the frequency (i.e. a signal "peak") would generate points with a higher red color content, frequencies where the signal level has a lower dependence on the frequency (a "plateau") would generate points with a higher blue color content.

The spectrum graph is generated by obtaining signal strength values for frequencies within a suitable number of ranges (coarsest to finest, with increasing resolution) given by the function FR, around the frequency the receiver is tuned to. The resulting curves are then superimposed on the tuning field, their number depending on how many such ranges have been thus measured. Alternatively, a single finest resolution scan can be taken, and the individual curves (of progressively coarser resolution) can be calculated from this single one.

This concept can be used with any digitally tunable radio and any personal computer. All that is required by the software is to send a command to the receiver "Set Frequency to XXX.XXX MHz". All remotely controllable receivers accept such command in one form or another. All digitally tuned receivers have a facility to accept such a "tune to" command. The relevant command in WiNRADiO receivers is SetFrequency(X), where X is in Hz. The low-level software then uses a matrix algorithm to find optimum dividers for the PLL.

From the foregoing, it will be seen that this invention is one well adapted to obtain all the ends and objects herein set forth, together with other advantages which are inherent to the structure.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

What is claimed is:

1. A virtual tuning system for radios that are controlled by a computer equipped with a pointer device such as a mouse, trackball or the like, the tuning system capable of spanning a very wide frequency band with a relatively small resolution, and the tuning system comprising:

a computer-generated, two-dimensional graphical field traversed by a cursor controlled by the computer pointer device, the field comprising a first graphical dimension representing frequency and a second graphical dimension indicating tuning resolution;

software means for concurrently converting cursor movements and positions within the two-dimensional field to control signals that concurrently tune the radio; and, whereby the computer pointer device selects the tuned frequency of the radio in accordance with cursor movement along one of said graphical dimensions and the rate whereby the selected frequency may be varied in accordance with cursor position relative to the other of said graphical dimensions.

2. The virtual tuning system as defined in claim 1 wherein the first graphical dimension of said graphical field is displayed horizontally, and the second graphical dimension of said field is displayed vertically.

3. The virtual tuning system as defined in claim 2 further comprising a display of the actual tuned frequency of the receiver, and a display of the cursor frequency.

4. The virtual tuning system as defined in claim 1 wherein the graphical field employs a cartesian or non-cartesian co-ordinate system comprising a first co-ordinate representing frequency and a second co-ordinate representing tuning resolution.

5. The virtual tuning system as defined in claim 1 further comprising means for generating and displaying a spectrum display concurrently with display of said graphical field.

6. The virtual tuning system as defined in claim 5 wherein the spectrum display is graphically superimposed as a virtual third dimension on the two-dimensional tuning field.

7. The virtual tuning as defined in claim 1 wherein said software comprises:

a) means for determining and setting an initial frequency;
b) means for determining the initial cursor position;
c) means for tuning the receiver to a frequency corresponding to the cursor position in the previous step;
d) means for concurrently monitoring cursor movement;
e) means for calculating a new operating frequency in accordance with cursor movements; and,
f) means for repeating steps (a)–(e) in accordance with further cursor movements.

8. The virtual tuning system as defined in claim 7 wherein said means for calculating a new operating frequency in accordance with cursor movements comprises:

means for defining a frequency resolution function $$FR(y)=FR_{max}+(FR_{min}-FR_{max})*(y-y_{min})/(y_{max}-y_{min}),$$

where $y_{min}$ is the minimum vertical display coordinate, $y_{max}$ is the maximum vertical display coordinate, $FR_{min}$ is the finest tuning resolution of the receiver, and $FR_{max}$, the coarsest frequency resolution, $$=(f_{max}-f_{min})/(x_{max}-x_{min}+1),$$

where $f_{max}$ and $f_{min}$ are the maximum and the minimum frequencies the receiver can be tuned to, respectively; and $x_{max}$ and $x_{min}$ are maximum and minimum horizontal coordinates of the tuning window.

9. The virtual tuning method as defined in claim 8 further comprising means for calculating the new frequency f2 from the formula $$f2 = f1 + (x2-x1) * FR(y2-y1),$$

where f1 is the old frequency, and f2 is the new frequency, x1, y1 are the new coordinates of the cursor, x2, y2 are the old coordinates of the cursor, and FR is a function describing a relationship between the position of the cursor and the frequency resolution.

10. A virtual tuning system for computer-controlled, mouse-equipped radios which is capable of spanning a very wide frequency band with a relatively small resolution, the tuning system comprising:
    a computer-generated, two-dimensional graphical field traversed by a cursor controlled by the computer mouse, the field comprising a first axis representing frequency and a second axis indicating tuning resolution;
    software means for concurrently converting cursor movements and positions within the two-dimensional field to control signals that concurrently tune the radio; and,
    whereby the computer mouse selects the tuned frequency of the radio in accordance with cursor movement along one of said axis's and the rate whereby the selected frequency may be varied in accordance with cursor position relative to the other of said axis's.

11. The virtual tuning system as defined in claim 10 wherein the first axis of said graphical field is displayed horizontally, and the second axis of said field is displayed vertically.

12. The virtual tuning system as defined in claim 10 further comprising a display of the actual tuned frequency of the receiver, and a display of the cursor frequency.

13. The virtual tuning system as defined in claim 10 further comprising means for generating and displaying a spectrum display concurrently with display of said graphical field.

14. The virtual tuning system as defined in claim 13 wherein the spectrum display is graphically superimposed as a virtual third dimension on the two-dimensional tuning field.

15. The virtual tuning as defined in claim 10 wherein said software comprises:
    a) means for determining and setting an initial frequency;
    b) means for determining the initial cursor position;
    c) means for tuning the receiver to a frequency corresponding to the cursor position in the previous step;
    d) means for concurrently monitoring cursor movement;
    e) means for calculating a new operating frequency in accordance with cursor movements; and,
    f) means for repeating steps (a)–(e) in accordance with further cursor movements.

16. The virtual tuning system as defined in claim 15 wherein said means for calculating a new operating frequency in accordance with cursor movements comprises:
    means for defining a frequency resolution function $$FR(y) = FR_{max} + (FR_{min} - FR_{max}) * (y - y_{min})/(y_{max} - y_{min}),$$

where $y_{min}$ is the minimum vertical display coordinate, $y_{max}$ is the maximum vertical display coordinate, $FR_{min}$ is the finest tuning resolution of the receiver, and
    $FR_{max}$, the coarsest frequency resolution, $$= (f_{max} - f_{min})/(x_{max} - x_{min} + 1),$$

where $f_{max}$ and $f_{min}$ are the maximum and the minimum frequencies the receiver can be tuned to, respectively; and $x_{max}$ and $x_{min}$ are maximum and minimum horizontal coordinates of the tuning window.

17. The virtual tuning method as defined in claim 16 further comprising means for calculating the new frequency f2 from the formula $$f2 = f1 + (x2-x1) * FR(y2-y1),$$

where f1 is the old frequency, and f2 is the new frequency, x1, y1 are the new coordinates of the cursor, x2, y2 are the old coordinates of the cursor, and FR is a function describing a relationship between the position of the cursor and the frequency resolution.

18. The virtual tuning system as defined in claim 17 wherein the first axis of said graphical field is displayed horizontally, and the second axis of said field is displayed vertically.

19. The virtual tuning system as defined in claim 18 further comprising a display of the actual tuned frequency of the receiver, and a display of the cursor frequency.

20. A method for virtually tuning radios that are controlled by a computer equipped with a pointer device such as a mouse, trackball or the like, the method capable of spanning a very wide frequency band with a relatively small resolution, said method comprising the steps of:
    generating a two-dimensional graphical field upon the computer that is traversed by a cursor controlled by the computer pointer device, the field comprising a first graphical dimension representing frequency and a second graphical dimension indicating tuning resolution;
    concurrently converting cursor movements and positions within the two-dimensional field to control signals that concurrently tune the radio; and,
    whereby the computer pointer device selects the tuned frequency of the radio in accordance with cursor movement along one of said graphical dimensions and the rate whereby the selected frequency may be varied in accordance with cursor position relative to the other of said graphical dimensions.

21. The method as defined in claim 20 further comprising the steps of displaying the first graphical dimension of said graphical field horizontally, and displaying the second graphical dimension of said field vertically.

22. The method as defined in claim 21 further comprising the steps of displaying the actual tuned frequency of the receiver, and concurrently displaying the cursor frequency.

23. The method as defined in claim 21 further comprising the step of generating and displaying a spectrum display concurrently with display of said graphical field.

24. The method as defined in claim 23 further comprising the step of graphically superimposing the spectrum display as a virtual third dimension on the two-dimensional tuning field.

25. The method as defined in claim 20 wherein said generating step comprises the steps of:
    a) determining and setting an initial frequency;
    b) determining the initial cursor position;
    c) tuning the receiver to a frequency corresponding to the cursor position in the previous step;
    d) concurrently monitoring cursor movement;
    e) calculating a new operating frequency in accordance with cursor movements;
    f) repeating steps (a)–(e) in accordance with further cursor movements.

26. The method as defined in claim 25 wherein said step (e) comprises the steps of defining a frequency resolution function $$FR(y)=FR_{max}+(FR_{min}-FR_{max}) * (y-y_{min})/(y_{max}-y_{min}),$$

where $y_{min}$ is the minimum vertical coordinate, $y_{max}$ is the maximum vertical coordinate, $FR_{min}$ is the finest tuning resolution of the receiver, and $FR_{max}$, the coarsest frequency resolution, $$=(f_{max}-f_{min})/(x_{max}-x_{min}+1)$$

where $f_{max}$ and $f_{min}$ are the maximum and the minimum frequencies the receiver can be tuned to, respectively; and $x_{max}$ and $x_{min}$ are maximum and minimum horizontal coordinates of the tuning window.

27. The method as defined in claim 26 further comprising the step of calculating the new frequency f2 of said step (e) from the formula $$f2=f1+(x2-x1)*FR(y2-y1),$$

where f1 is the old frequency, and f2 is the new frequency, x1, y1 are the new coordinates of the cursor, x2, y2 are the old coordinates of the cursor, and FR is a function describing a relationship between the position of the cursor and the frequency resolution.

* * * * *